United States Patent
Yu

(10) Patent No.: US 12,040,761 B2
(45) Date of Patent: *Jul. 16, 2024

(54) AUDIO SIGNAL MUTING APPARATUS USING NEGATIVE POWER, AND DIGITAL SIGNAL CONVERSION APPARATUS EQUIPPED WITH SAME

(71) Applicant: DREAMUS COMPANY, Seoul (KR)

(72) Inventor: Seung Ho Yu, Incheon (KR)

(73) Assignee: DREAMUS COMPANY, Seoul (KR)

( * ) Notice: Subject to any disclaimer, the term of this patent is extended or adjusted under 35 U.S.C. 154(b) by 228 days.

This patent is subject to a terminal disclaimer.

(21) Appl. No.: 17/716,951

(22) Filed: Apr. 8, 2022

(65) Prior Publication Data

US 2022/0360242 A1    Nov. 10, 2022

(30) Foreign Application Priority Data

May 7, 2021   (KR) .......................... 10-2021-0059203

(51) Int. Cl.
*H03G 3/34* (2006.01)
(52) U.S. Cl.
CPC ....... *H03G 3/344* (2013.01); *H03G 2201/103* (2013.01)

(58) Field of Classification Search
CPC .......................... H03G 3/344; H03G 2201/103
USPC ..... 381/94.5, 94.1, 94.7; 330/149, 124 R, 51
See application file for complete search history.

(56) References Cited

U.S. PATENT DOCUMENTS 6,016,352 A * 1/2000 Barmore ................ H03G 3/348
                                                        381/104
2020/0036355 A1   1/2020 Lee et al.

FOREIGN PATENT DOCUMENTS

| JP | 2013239847 A | 11/2013 |
| KR | 20100108602 A | 10/2010 |
| KR | 20180113882 A | 10/2018 |
| TW | 201837899 A | 10/2018 |

* cited by examiner

*Primary Examiner* — Vivian C Chin
*Assistant Examiner* — Con P Tran

(57) ABSTRACT

The present exemplary embodiments provide an audio signal muting apparatus and a digital signal conversion apparatus which remove a negative pop noise in a predetermined large range using a negative power for the transistor of the audio signal muting apparatus.

12 Claims, 7 Drawing Sheets

AUDIO SIGNAL MUTING APPARATUS USING NEGATIVE POWER, AND DIGITAL SIGNAL CONVERSION APPARATUS EQUIPPED WITH SAME

CROSS-REFERENCE TO RELATED APPLICATIONS

This application claims priority to and the benefit of Korean Patent Application No. 10-2021-0059203 filed in the Korean Intellectual Property Office on May 7, 2021, the entire contents of which are incorporated herein by reference.

TECHNICAL FIELD

The present disclosure relates to an apparatus for muting an audio signal.

DESCRIPTION OF THE RELATED ART

When a digital to analog converter (DAC) is used in an audio reproducing device which reproduces an audio signal, a sound of a clearer and richer sound source can be provided to a user. As described above, in order to further improve a sound quality of the audio signal, a digital signal conversion apparatus which is mounted in an electronic device having an audio signal reproducing function such as an MP3 player or an audio for a vehicle to select a signal having a quality suitable for a user's preference and purpose is in the spotlight.

However, after electrically connecting the digital signal conversion apparatus to the audio signal reproducing apparatus, when a power is applied to the digital signal conversion apparatus or a power is turned off, there is a problem in that a pop noise is generated. There is another problem in that a sound quality of the audio signal is degraded due to the pop noise.

RELATED ART DOCUMENT

Patent Document (Patent Document 1) KR 10-2018-0113882 (Oct. 17, 2018)
(Patent Document 2) US 2020-0036355 (Jan. 30, 2020)
(Patent Document 3) TW 201837899 (Oct. 16, 2018)

SUMMARY

A major object of the exemplary embodiments of the present disclosure is to remove a negative pop noise in a predetermined range using a minus power in a transistor of an audio signal muting apparatus in a circumstance in that a big negative pop noise may be caused depending on a type of an operational amplifier (op-amp).

Other and further objects of the present invention which are not specifically described can be further considered within the scope easily deduced from the following detailed description and the effect.

According to an aspect of the present embodiment, an audio signal muting apparatus includes a mute control unit which removes a pop noise from an audio signal, and a negative power is applied to the mute control unit to remove a negative pop noise.

A gate of a transistor implemented in the mute control unit is controlled based on the negative power to adjust a voltage difference between a gate and a source of the transistor.

The larger the magnitude of the negative pop noise, the larger the voltage difference between the gate and the source is set.

As the negative power applied to the mute control unit, a negative voltage present on a circuit implemented in the audio signal muting apparatus is applied.

The negative voltage may be set to a fixed or variable value.

The mute control unit includes a plurality of transistors which is connected with a dual transistor structure in which sources and drains of the plurality of transistors face each other.

The mute control unit includes a first transistor and a second transistor and a negative power is applied to a first gate of the first transistor and a second gate of the second transistor.

The audio signal muting device includes: a timing setting unit which sets a timing to remove a pop noise from the audio signal; and a timing adjusting unit which adjusts the timing.

The timing setting unit and mute control signal are connected by means of the first control element which performs a switching function and the timing setting unit and the timing adjusting unit are connected by means of the second control element which performs a switching function.

The second control element is connected to the negative power.

The second control element and the negative power are connected by means of a resistor.

The mute control unit includes: a first mute processing unit which mutes the audio signal at a time when the negative pop noise exists based on the timing; and a second mute processing unit which mutes the audio signal at a time when the positive pop noise exists based on the timing.

The timing adjusting unit includes: a first timing adjusting unit connected to the second control element; and a second timing adjusting unit connected to the first timing adjusting unit and the mute control unit.

The first timing adjusting unit is connected to the negative power.

The timing setting unit sets the timing based on at least one pop noise having a magnitude which is equal to or higher than a first reference value and the timing adjusting unit adjusts the timing based on at least one pop noise having a magnitude which is equal to or higher than a second reference value smaller than the first reference value.

According to another aspect of the present embodiment, a digital signal conversion apparatus includes a converter which converts an input digital audio signal into an analog audio signal; a clock generating unit which determines an operation timing to convert the digital audio signal into an analog audio signal based on the digital audio signal; an amplifier which amplifies the analog audio signal; and an audio signal muting device which mutes the analog audio signal based on a timing to remove a pop noise, the audio signal muting device includes: a mute control unit which removes a pop noise from an audio signal, and applies a negative power to the mute control unit to remove a negative pop noise.

As described above, according to the exemplary embodiments of the present disclosure, a negative pop noise in a predetermined large range may be removed using a minus power for the transistor of the audio signal muting apparatus.

Even if the effects are not explicitly mentioned here, the effects described in the following specification which are expected by the technical features of the present disclosure and their potential effects are handled as described in the specification of the present disclosure.

DETAILED DESCRIPTION OF THE EMBODIMENT

Hereinafter, in the description of the present disclosure, a detailed description of the related known functions will be omitted if it is determined that the gist of the present disclosure may be unnecessarily blurred as it is obvious to those skilled in the art and some exemplary embodiments of the present disclosure will be described in detail with reference to exemplary drawings.

The present disclosure is applicable to a digital signal conversion apparatus which is connected to an audio signal reproducing device to convert a digital audio signal into an analog audio signal. The present disclosure is also applicable to an audio signal reproducing device such as a video device, an MP3 player, an audio device in an electric device for a vehicle.

Figure 1A:
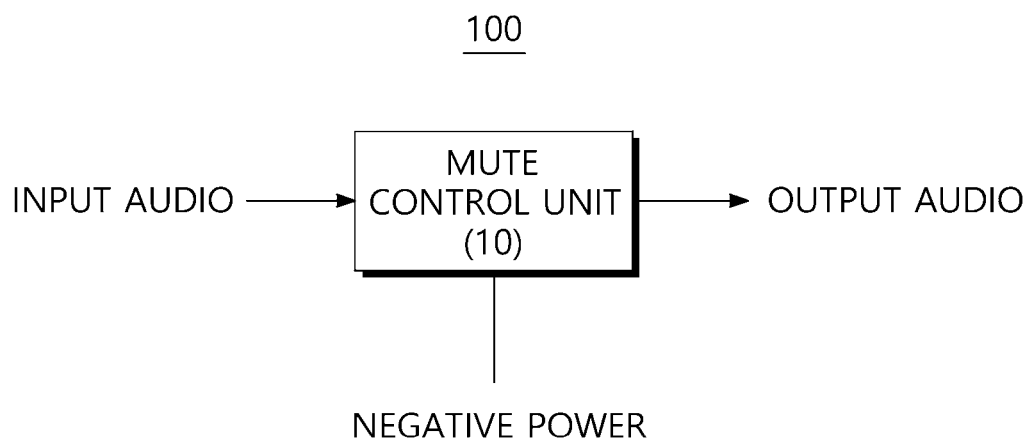
FIGS. 1A to 1C are views illustrating an audio signal muting apparatus according to an exemplary embodiment of the present disclosure.
Figure 1B:
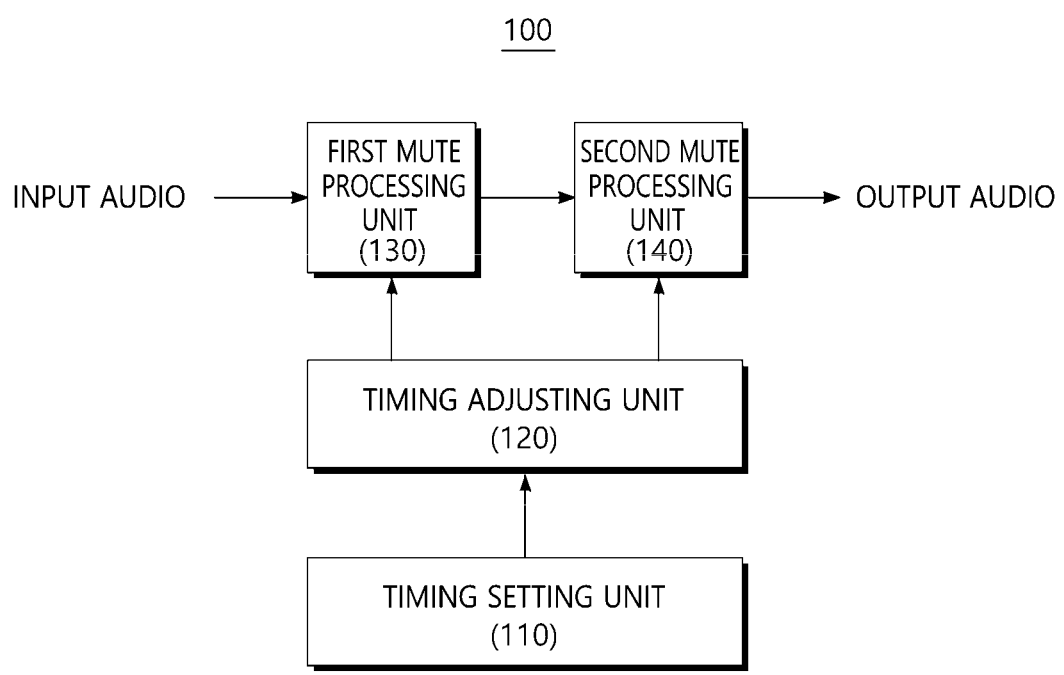
Figure 1C:
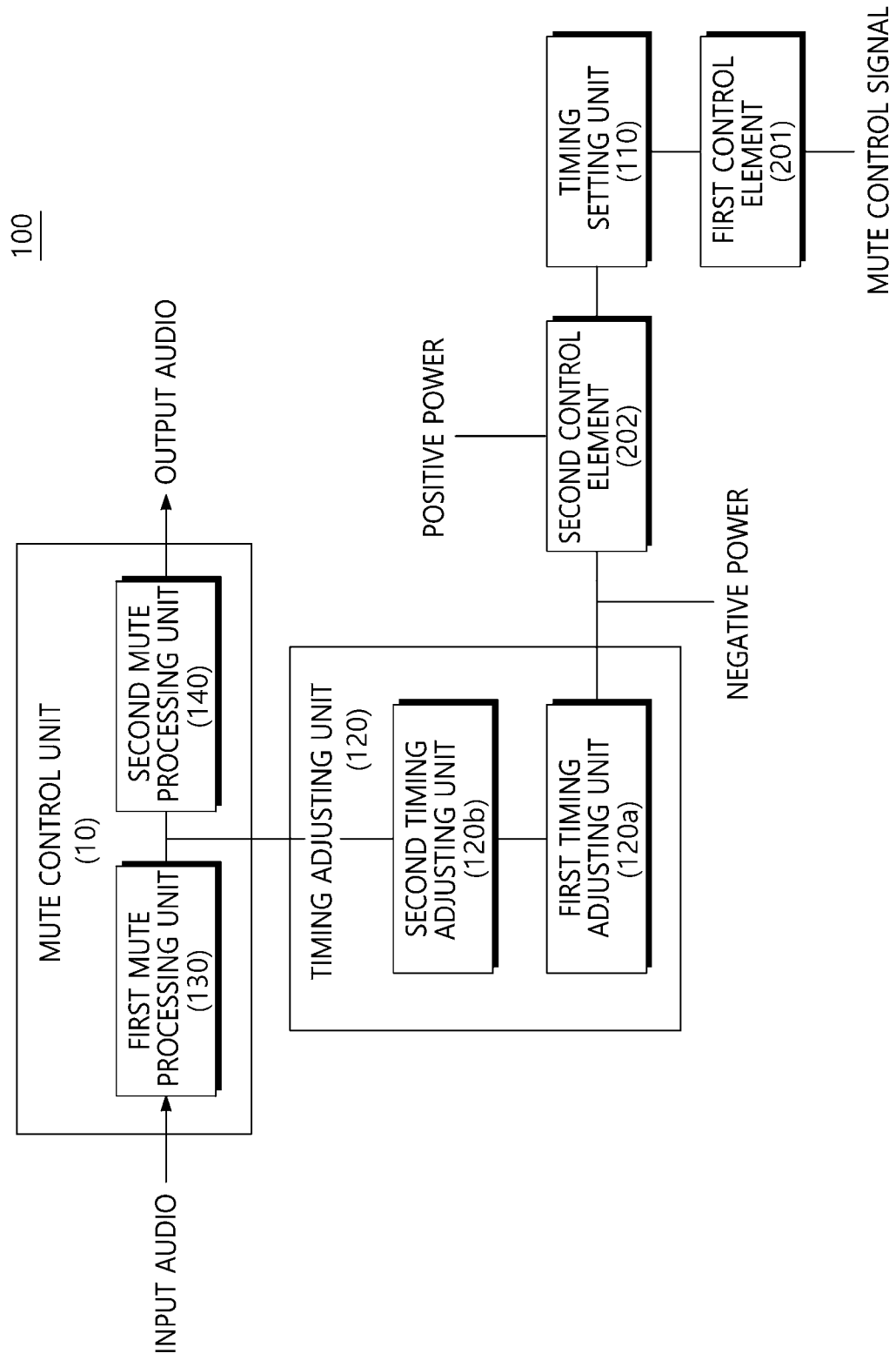

FIGS. 1A to 1C are views illustrating an audio signal muting apparatus according to an exemplary embodiment of the present disclosure.

Referring to FIG. 1A, the audio signal muting apparatus 100 includes a mute control unit 10 which removes a pop noise from the audio signal.

Referring to FIG. 1B, the audio signal muting apparatus 100 includes a timing setting unit 110, a timing adjusting unit 120, a first mute processing unit 130, and a second mute processing unit 140.

Referring to FIG. 1C, the audio signal muting apparatus 100 includes a timing setting unit 110, a first timing adjusting unit 120a, a second timing adjusting unit 120b, a first mute processing unit 130, a second mute processing unit 140, a first control element 201, and a second control element 202.

The audio signal muting apparatus 100 applies a negative power to the mute control unit 10 to remove a negative pop noise. A gate of a transistor implemented in the mute control unit 10 is controlled based on the negative power to adjust a voltage difference between the gate and a source of the transistor. The larger the negative pop noise, the larger the voltage difference between the gate and the source is set.

As the negative power applied to the mute control unit 10, a negative voltage existing on the circuit implemented in the audio signal muting apparatus may be applied. The negative voltage may be set to a fixed or variable value.

The mute control unit 10 includes a plurality of transistors which are connected in a dual transistor structure in which sources and drains of the plurality of transistors face each other. The mute control unit 10 includes a first transistor and a second transistor and a negative power may be applied to a first gate of the first transistor and a second gate of the second transistor.

The audio signal muting apparatus 100 may include the timing setting unit 110 which sets a timing to remove the pop noise from the audio signal and the timing adjusting unit 120 which adjusts the timing.

The mute control unit 10 may include a first mute processing unit 130 which mutes the audio signal at a time when the negative pop noise exists based on the timing and a second mute processing unit 140 which mutes the audio signal at a time when a positive pop noise exists based on the timing.

The timing setting unit 110 and mute control signal may be connected by means of the first control element 201 which performs a switching function. The timing setting unit 110 and the timing adjusting unit 120 may be connected by means of the second control element 202 which performs a switching function.

The second control element 202 may be connected to a negative power. The second control element 202 and the negative power may be connected by means of a resistor.

The timing adjusting unit 120 may include the first timing adjusting unit 120a connected to the second control element 202. The timing adjusting unit 120 may include the second timing adjusting unit 120b connected to the first timing adjusting unit 120a and the mute control unit 10.

The first timing adjusting unit 120a may be connected to a negative power. The timing setting unit 110 sets a timing based on at least one pop noise having a magnitude which is equal to or larger than a first reference value and the timing adjusting unit 120 controls the timing based on at least one pop noise having a magnitude which is equal to or larger than a second reference value smaller than the first reference value.

The audio signal reproducing device reproduces an audio signal, and for example, includes a computer, a video device, an MP3 player, and an audio device in an electric device for a vehicle.

The audio signal reproducing apparatus may be implemented by a HIFI audio module, for example. In this case, a voltage level of an audio signal output from the HIFI audio module is very high so that the digital signal conversion apparatus desirably includes an audio signal muting apparatus 100 to control the high output. The audio signal muting apparatus 100 proposed by the present disclosure may be included in the digital signal conversion apparatus 400.

The audio signal muting apparatus 100 has a configuration optimized for a high output and may include the timing setting unit 110 and the timing adjusting unit 120 to adjust the timing.

When an audio signal having a high output is input, the timing setting unit 110 performs a function of primarily setting a mute timing with respect to the audio signal. Specifically, the timing setting unit 110 performs a function to set an overall mute timing. The timing setting unit 110 sets a mute timing for the entire input audio signal to perform a function of adjusting the overall mute timing.

The timing adjusting unit 120 performs a function of secondarily adjusting a mute timing with respect to the audio signal to which the mute timing is primarily set by the timing setting unit 110. To be more specific, the timing adjusting unit 120 performs a function for setting a fine mute timing.

The timing adjusting unit 120 adjusts the mute timing for each part of the audio signal to which the mute timing is set to set the fine mute timing.

According to the exemplary embodiment at least one timing adjusting unit 120 may be provided. The fine mute timing is desirably performed at least two times to increase the accuracy of the timing so that at least two timing adjusting units 120 may be desirably provided in the exemplary embodiment.

When the audio signal muting apparatus 100 includes only the timing setting unit 110, there may be a problem in that the pop noise is rather caused while the audio signal muting apparatus 100 mutes the audio signal. According to the present disclosure, in consideration of this problem, the audio signal muting apparatus 100 includes at least one timing adjusting unit 120 together with the timing setting unit 110.

When an audio signal having a high output is input, the first mute processing unit 130 performs a function of primarily muting the audio signal based on the mute timing set and adjusted by the timing setting unit 110 and the timing adjusting unit 120.

The digital signal conversion apparatus is electrically connected to the audio signal reproducing device to perform a function of improving a sound quality of the audio signal. At this time, the first mute processing unit 130 provided in the digital signal conversion apparatus serves to mute the audio signal at a determined mute timing to remove a pop noise generated when the power of the digital signal conversion apparatus is on/off.

The first mute processing unit 130 primarily mutes the audio signal to remove a pop noise related to the audio signal, specifically, a negative pop noise.

When the input audio signal is primarily muted at the determined timing by the first mute processing unit 130, the second mute processing unit 130 serves to secondarily mute the audio signal based on the mute timing set and adjusted by the timing setting unit 110 and the timing adjusting unit 120.

The second mute processing unit 140 mutes the audio signal at the determined timing together with the first mute processing unit 130 to remove the pop noise. At this time, the second mute processing unit 140 removes the positive pop noise related to the audio signal.

According to the exemplary embodiment, the audio signal muting apparatus 100 may include only the first mute processing unit 130. In this case, the first mute processing unit 130 may serve to remove a positive pop noise together with the negative pop noise.

Figure 2:
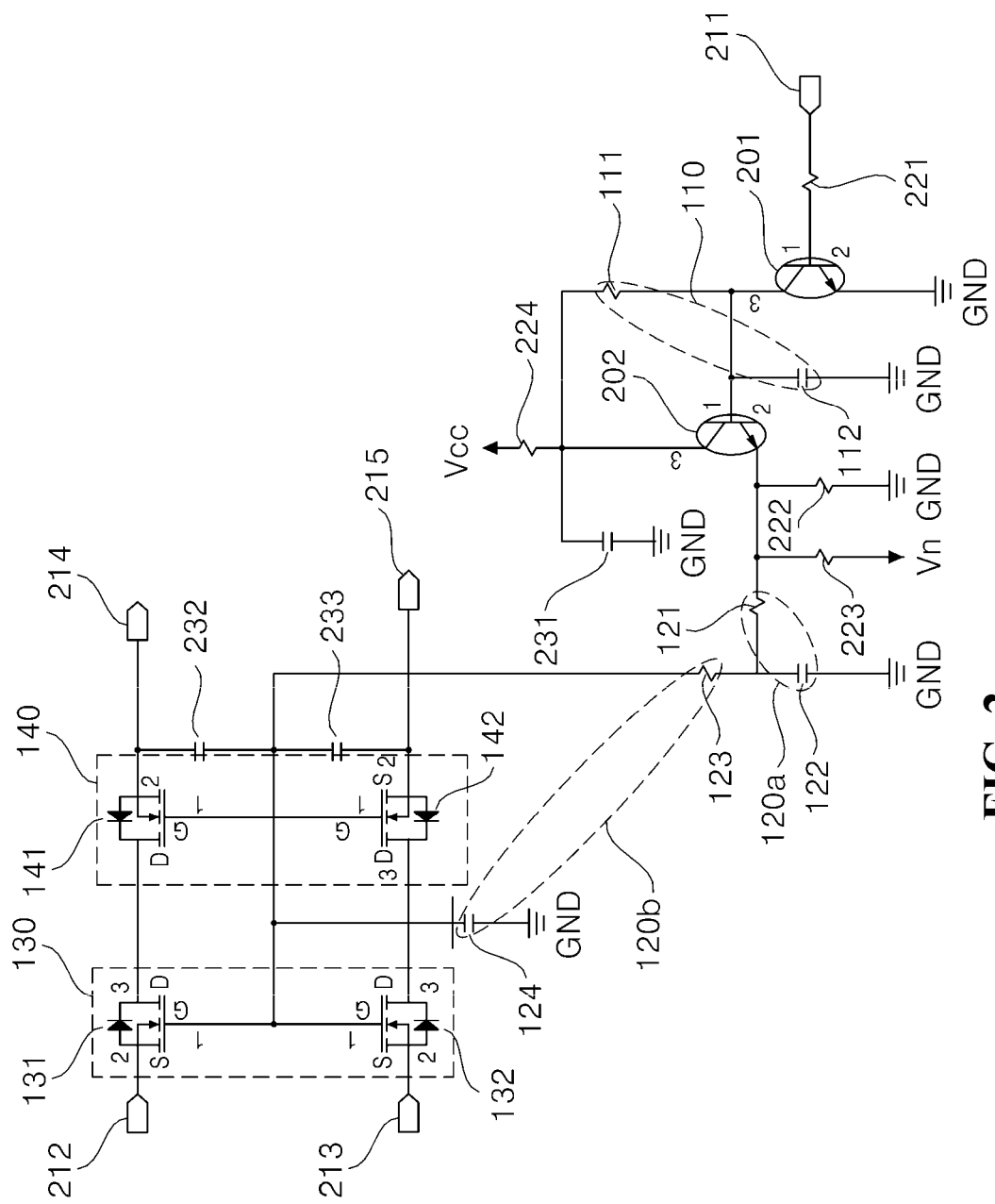
FIG. 2 is a circuit diagram specifically illustrating an internal configuration of an audio signal muting apparatus according to an exemplary embodiment of the present disclosure.

FIG. 2 is a circuit diagram specifically illustrating an internal configuration of an audio signal muting apparatus according to an exemplary embodiment of the present disclosure.

The timing setting unit 110 includes a first resistor 111 and a first capacitor 112. According to the exemplary embodiment, the first resistor 111 and the first capacitor 112 are connected in parallel.

The first resistor 111 is connected to a collector of the first transistor 201 to serve to adjust an output voltage.

One side of the first capacitor 112 is connected to the collector of the first transistor 201 and the other end is connected to the ground GND.

An emitter of the first transistor 201 is connected to the ground GND and a base of the first transistor 201 is connected to a mute signal input unit 211 which mutes the audio signal in the audio signal reproducing device.

The audio signal muting apparatus 100 may further include a second resistor 221 which is connected to the first transistor 201 in series. One side of the second resistor 221 is connected to the mute signal input unit 211 and the other side is connected to the first transistor 201. The second resistor 221 may operate as a protection resistor.

At least two timing adjusting units 120 may be provided in the audio signal muting apparatus 100. According to the exemplary embodiment of FIG. 2, two timing adjusting units 120 are provided in the audio signal muting apparatus 100. Hereinafter, in consideration of this, a first timing adjusting unit 120a and a second timing adjusting unit 120b will be separately described.

The first timing adjusting unit 120a includes a third resistor 121 and a second capacitor 122. According to the exemplary embodiment, the third resistor 121 and the second capacitor 122 are connected in series.

The third resistor 121 is connected to an emitter of the second transistor 202 to serve to adjust an output voltage.

One side of the second capacitor 122 is connected to the third resistor 121 and the other side is connected to the ground GND.

An emitter of the second transistor 202 is connected to Vcc and a base of the second transistor 202 is connected to the timing setting unit 110. The positive voltage is connected to the second transistor 202 via a seventh resistor 224.

The audio signal muting apparatus 100 may further include a fourth resistor 222 which is connected to the third transistor 121. The fourth resistor 222 and a sixth resistor 223 serve to adjust an output voltage. One side of the fourth resistor 222 is connected to the emitter of the second transistor 202 and the other side is connected to the ground GND. One side of the sixth resistor 223 is connected to the emitter of the second transistor 202 and the other side is connected to a negative voltage Vn.

The audio signal muting apparatus 100 may further include a third capacitor 231 which is connected to the timing setting unit 110. One side of the third capacitor 231 is connected to the first resistor 111 of the timing setting unit 110 and the other side is connected to the ground GND. For example, the third capacitor 231 may be implemented as C218.

The second timing adjusting unit 120b includes a fifth resistor 123 and a fourth capacitor 124. According to the exemplary embodiment, the fifth resistor 123 and the fourth capacitor 124 are connected.

The fifth resistor 123 is connected to the first timing adjusting unit 120a to serve to adjust an output voltage.

One side of the fourth capacitor 124 is connected to the fifth resistor 123 and the other side is connected to the ground GND.

The audio signal muting apparatus 100 may further include a fifth capacitor 232 and a sixth capacitor 233 connected to the second timing adjusting unit 120b. According to the exemplary embodiment, the fifth resistor 232 and the sixth capacitor 233 are connected.

One side of the fifth capacitor 232 is connected to a fifth resistor 123 of the second timing adjusting unit 120b and the other side is connected to the second mute processing unit 140.

Similarly, to the fifth capacitor 232, one side of the sixth capacitor 232 is connected to the fifth resistor 123 of the second timing adjusting unit 120b and the other side is connected to the second mute processing unit 140.

According to the exemplary embodiment, the second mute processing unit 140 may be implemented as a dual FET. In this case, the fifth capacitor 232 and the sixth capacitor 233 are connected to FETs of the second mute processing unit 140. The fifth capacitor 232 and the sixth capacitor 233 are provided in the audio signal muting apparatus 100 in an open type.

The first mute processing unit 130 includes a first field effect transistor (FET) 131 and a second FET 132. When the first mute processing unit 130 is implemented as a single FET, it is difficult to completely remove the pop noise and specifically, it is difficult to remove the pop noise which is leaked to a negative side. The pop noise refers to a noise generated when the power is supplied or power supplying is stopped and is generated due to a voltage of a capacitor charged when a circuit having a capacitor with a charged voltage is connected to another electric circuit.

According to the exemplary embodiment, in order to solve this problem, the first mute processing unit 130 is implemented as a dual FET. According to the exemplary embodiment, the first FET 131 and the second FET 132 are disposed such that a drain and a source of the first FET 131 and a drain and a source of the second FET 132 face each other to solve the problem.

When an audio signal received through a right input terminal (AUDIO_R_IN) 212 is input to a gate of the first FET 131, the first FET 131 serves to mute the audio signal in accordance with the timing determined by the timing setting unit 110, the first timing adjusting unit 120a, and the second timing adjusting unit 120b to transmit the muted audio signal to the second mute processing unit 140.

When an audio signal received through a left input terminal (AUDIO_L_IN) 213 is input to a gate of the second FET 132, the second FET 132 serves to mute the audio signal in accordance with the timing determined by the timing setting unit 110, the first timing adjusting unit 120a and the second timing adjusting unit 120b to transmit the muted audio signal to the second mute processing unit 140.

The second mute processing unit 140 includes a third FET 141 and a fourth FET 142. Similarly to the first mute processing unit 130, the second mute processing unit 140 is also implemented as a dual FET. Further, the third FET 141 and the fourth FET 142 are disposed such that a drain and a source of the third FET 141 and a drain and a source of the fourth FET 142 face each other.

When the muted audio signal is input from the first FET 131, the third FET 141 serves to mute the audio signal in accordance with a timing determined by the timing setting unit 110, the first timing adjusting unit 120a, and the second timing adjusting unit 120b to output the muted audio signal through the right output terminal (AUDIO_R_OUT) 214.

When the muted audio signal is input from the second FET 132, the fourth FET 142 serves to mute the audio signal in accordance with a timing determined by the timing setting unit 110, the first timing adjusting unit 120a, and the second timing adjusting unit 120b to output the muted audio signal through the left output terminal (AUDIO_L_OUT) 215.

Figure 3A:
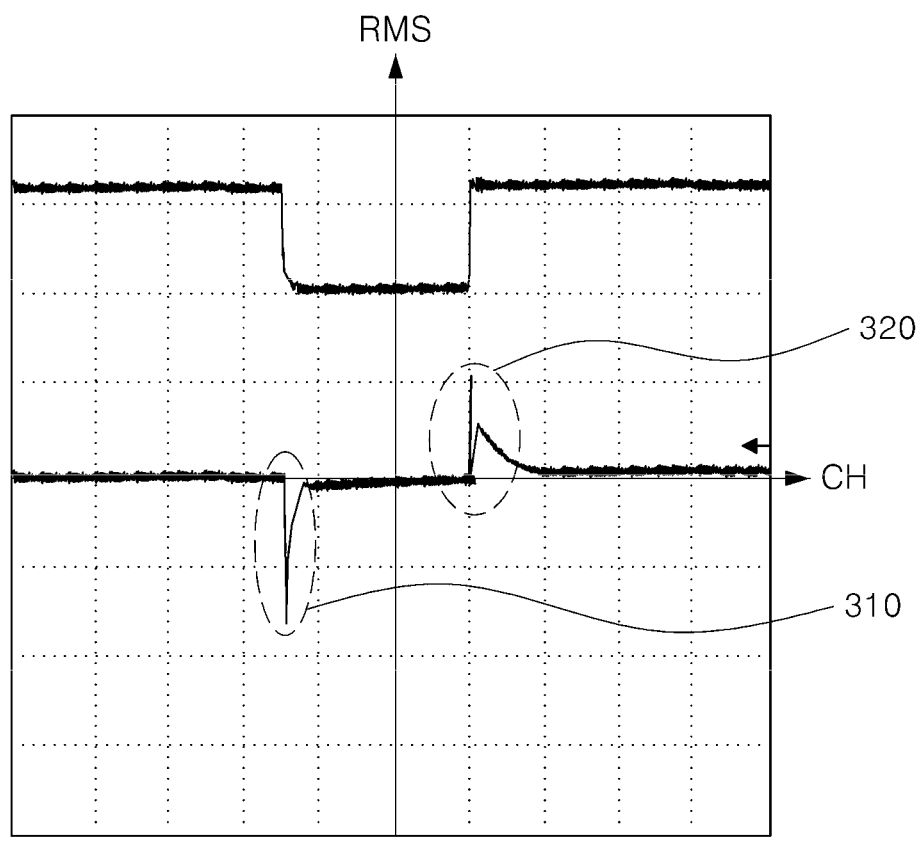
FIGS. 3A and 3B are reference diagrams for explaining a function performed by an audio signal muting apparatus according to an exemplary embodiment of the present disclosure.
Figure 3B:
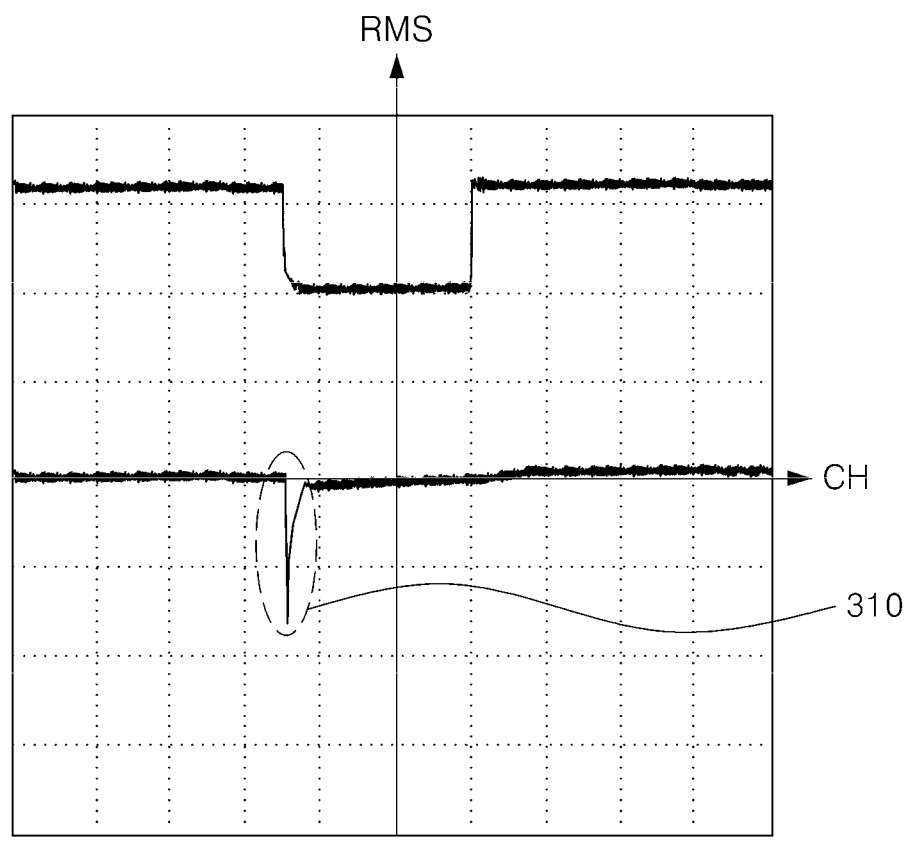

FIGS. 3A and 3B are reference diagrams for explaining a function performed by an audio signal muting apparatus according to an exemplary embodiment of the present disclosure.

The audio signal muting apparatus 100 removes the pop noise generated when the power is turned on/off after mounting the digital signal conversion apparatus in the audio signal reproducing device.

The pop noise includes a negative pop noise 310 and a positive pop noise 320. The first mute processing unit 130 provided in the audio signal muting apparatus 100 primarily mutes the input audio signal in accordance with the determined mute timing to remove the negative pop noise 310.

The second mute processing unit 140 provided in the audio signal muting apparatus 100 secondarily mutes the audio signal which is primarily muted by the first mute processing unit 130 in accordance with the determined mute timing to remove the positive pop noise 320.

A negative pop noise in a predetermined range may be removed using a negative power source for a transistor of an audio signal muting apparatus in a circumstance in that a big negative pop noise 310 may be caused depending on a type of an operational amplifier (op-amp). A gate of the transistor implemented in the mute control unit is controlled based on the negative power to adjust a voltage difference between a gate and a source of the transistor and all the negative pop noises which are equal to or higher than the voltage may be removed.

Hereinafter, a digital signal conversion apparatus including the audio signal muting apparatus 100 will be described.

Figure 4:
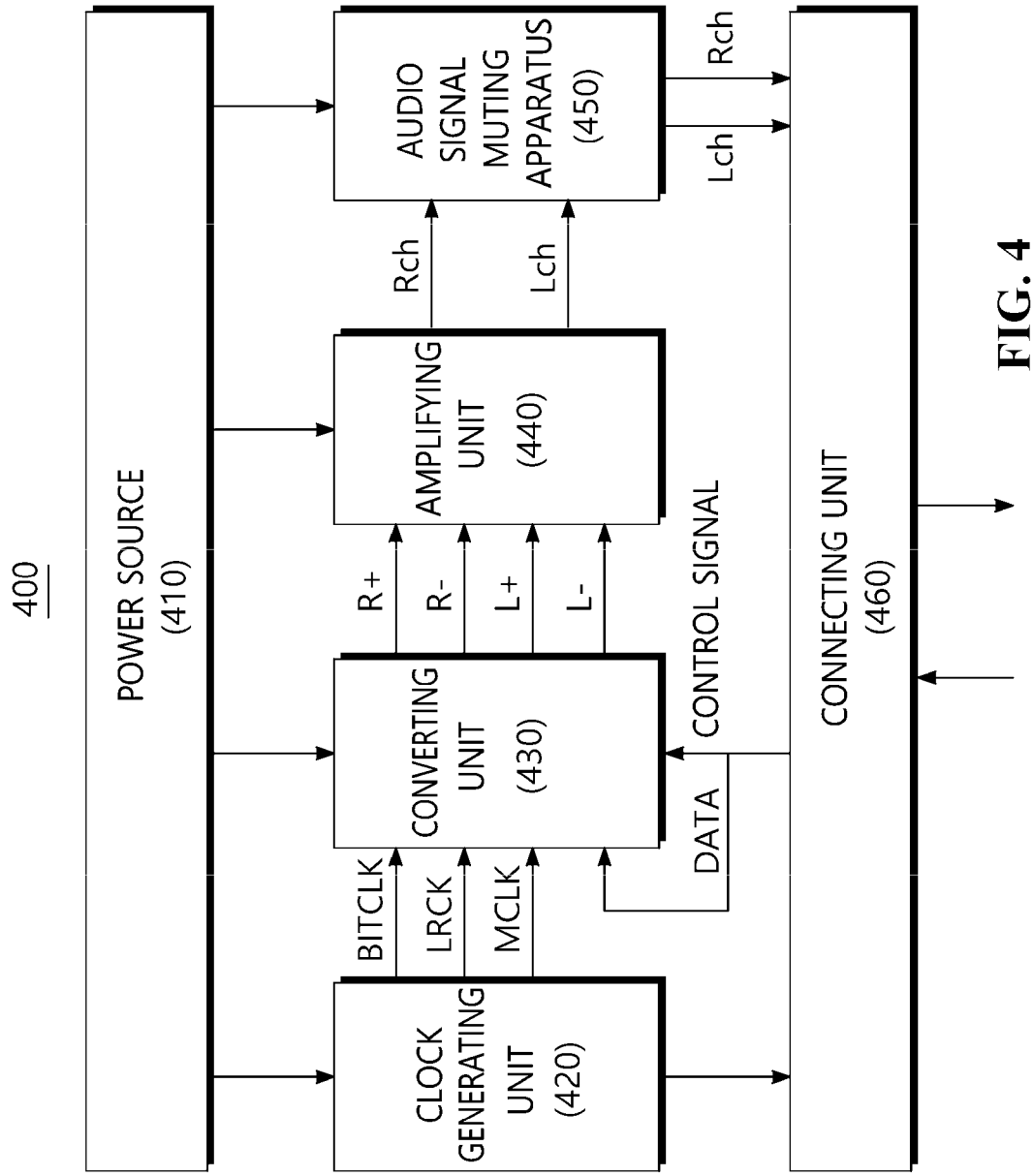
FIG. 4 is a view illustrating a digital signal conversion apparatus according to another exemplary embodiment of the present disclosure.

FIG. 4 is a view illustrating a digital signal conversion apparatus according to another exemplary embodiment of the present disclosure.

Referring to FIG. 4, the digital signal conversion apparatus 400 includes a power source 410, a clock generating unit 420, a converting unit 430, an amplifying unit 440, an audio signal muting apparatus 450, and a connecting unit 460.

The digital signal conversion apparatus 400 is electrically connected to an audio signal reproducing device (not illustrated) to serve to convert a digital audio signal into an analog signal. To be more specific, when an audio signal with a digital format is input from the audio signal reproducing device, the digital signal conversion apparatus 400 converts the audio signal into an analog signal format and then transmits the converted audio signal to the audio signal reproducing device. The digital signal conversion apparatus 400 contributes to allow the audio signal reproducing device to reproduce the digital contents to output a high quality sound source by means of this process.

The digital signal conversion apparatus 400 may be implemented as a module type, in the present disclosure. In this case, the digital signal conversion apparatus 400 has an advantage in that users may easily change, replace, and upgrade the modules so that the system can be easily changed in accordance with the request of the user.

The digital signal conversion apparatus 400 may have a high current consumption to contribute to allow the audio signal reproducing device to output a high quality sound source. In consideration of this, the digital signal conversion apparatus 400 individually controls the converting unit 440 and the amplifying unit 440 to minimize the power consumption according to the usage.

In the digital signal conversion apparatus 400, a layout structure of the power source 410, the converting unit 440, and the amplifying unit 440 may be arbitrarily changed in accordance with the purpose of reducing the noise. Further, in the digital signal conversion apparatus 400, a position or a connection relationship of the power source 410, the converting unit 440, and the amplifying unit 440 may have a design structure optimized for the flow of data or a signal.

The layout and the design of the digital signal conversion apparatus 400 may be set using hardware or software. When the modules which configure the digital signal conversion apparatus 400 are changed, the initialization of the flow of the data or signals is necessary and the initialization may be automatically set by a module embedded in the hardware or by a software which is receivable by a separate Internet or a mobile application.

The power source 410 performs a function of supplying an electric energy to the clock generating unit 420, the converting unit 440, the amplifying unit 440, and the audio signal muting apparatus 450 by means of a physical action or a chemical action. The power source 410 is not provided in the digital signal conversion apparatus 400, but may be disposed in the outside of the digital signal conversion apparatus 400 to supply the power.

In consideration of a characteristic of the HIFI audio module which is sensitive to the noise, the power source 410 may have a circuit structure to reduce the noise. For example, the power source 410 may include a plurality of power supply units (not illustrated) and noise removing units (not illustrated). At this time, the power supply units are separated to have a voltage value optimized to reduce the noise.

The power supply unit may use a potential difference caused by the metal ionization difference and may include a primary battery which cannot be charged and a secondary battery which is rechargeable. A type of the power supply unit may be changed according to the characteristic of the audio signal reproducing device.

The noise removing unit serves to remove a noise induced in the power source 410.

The noise removing unit has a circuit structure in which electric elements are sequentially connected. At this time, the circuit structure primarily uses a bead to remove a high frequency noise, secondarily uses a low drop out (LDO) regulator, tertiary uses a capacitor having a low serial equivalent resistance value, and quarternarily uses a large capacity capacitor.

The LDO regulator linearly adjusts a voltage even when the supplied voltage is very close to the output voltage. The LDO regulator is advantageous in that the noise is reduced by the small voltage drop and the small ripple and the price is low due to the simple circuit.

The clock generating unit 420 serves to generate a clock signal to determine an operation timing of the digital signal conversion apparatus 400. The clock generating unit 420 may generate a master clock MCLK, a left-right clock LRCK, or a bit clock BITCLK.

The MCLK refers to a master clock. The clock generating unit 420 determines a final operation timing of the digital signal conversion apparatus 400 using the MCLK.

The LRCK refers to a clock for a left channel and a right channel of the digital audio signal. When L channel information is transmitted, the LRCK is set to 1 and when R channel information is transmitted, the LRCK is set to 0.

The BITCLK refers to a clock which is transmitted in conjugation with a basic bit of the digital signal. The clock generating unit 420 is synchronized with the bit clock using the BITCLK to determine whether the digital signal is 0 or 1.

The clock signals generated in the clock generating unit 420 is input to the audio signal reproducing device. The clock generating unit 420 uses a clock created in a phased lock loop (PLL) to exactly create the analog signal. The digital signal conversion apparatus 400 directly creates the clock by means of the clock generating unit 420 so that an analog signal having a low jitter can be generated.

The converting unit 440 serves to convert a digital signal input from the audio signal reproducing device into an analog signal using the synchronized control signal and clock signals.

The converting unit 440 may be implemented by a plurality of modules. In this case, the converting unit 440 makes it possible to convert a high quality analog signal by averaging the output noises. However, when the converting unit 440 is implemented by a plurality of modules, the power consumption is increased, but this problem may be solved by individually controlling the currents of the converting unit 440.

The converting unit 440 may have a spacing structure to suppress the duplication of portions in which the digital noise is induced on an internal circuit pattern. According to the spacing structure, the distances are spaced on the two-dimensional plane or are spatially spaced in different layers on a three-dimensional space. At this time, the spacing distance may have a predetermined value or higher in consideration of the size of the digital signal conversion apparatus 400 and a reproduced sound quality.

The synchronization is performed to match the operation timings of the digital signal conversion apparatus 400 and the audio signal reproducing device and may be implemented by unifying the reference times of the clock signals. In the present exemplary embodiment, the synchronization may refer to not only the matching of the operation timings between the modules, but also matching of the data.

The amplifying unit 440 serves to amplify an analog signal which is an output of the converting unit 440.

The amplifying unit 440 includes a pre-amplifier which adjusts an analog signal and a power-amplifier which amplifies the power and is also implemented by an integrated amplifier in which the pre-amplifier and the power amplifier are combined. However, according to the exemplary embodiment, the type of the amplifying unit 440 is not limited thereto and arbitrary modified according to the purpose and the function of the digital signal conversion apparatus 400.

The amplifying unit 440 may have a design optimized for the converting unit 440 to reduce the noise. Further, the wiring line of the internal circuit of the amplifying unit 440 has a maximum spacing structure to suppress the duplication of the portions in which the digital noise is induced. The layout of the spacing structure is the same as in the converting unit 440. The spaced distance may have a predetermined value or higher in consideration of the size of the digital signal conversion apparatus 400 and a reproduced sound quality.

The audio signal muting apparatus 450 serves to mute an audio signal based on the predetermined timing. The audio signal muting apparatus 450 is the same concept as the audio signal muting device 100 which has been described above with reference to FIGS. 1 to 3. Accordingly, the detailed description of the audio signal muting apparatus 450 is omitted here.

The connecting unit 460 electrically or mechanically connects the digital signal conversion apparatus 400 to the audio signal reproducing device and serves as a passage of the electric signal between the digital signal conversion apparatus 400 and the audio signal reproducing device.

The connecting unit 460 receives an audio signal from the audio signal reproducing apparatus to transmit the audio signal to the converting unit 440 and includes an insulating material to suppress the flow of the electric signal in the air or to the body of the user.

The audio signal muting apparatus 450 includes a timing setting unit, a timing adjusting unit, and a mute control unit.

The timing setting unit performs a function of setting a timing to remove the pop nose from the audio signal. The timing setting unit is the same concept as the timing setting unit 110 of FIG. 1.

The timing setting unit includes a first voltage adjusting element and a first charging element.

The first voltage adjusting element adjusts an output voltage related to the audio signal. One side of the first voltage adjusting element is connected to a first control element which receives a mute control signal to mute the audio signal and the o the side is connected to the ground GND. The first voltage adjusting element is a concept corresponding to the first resistor of FIG. 2 and the first control element is a concept corresponding to the first transistor of FIG. 2.

The first charging element is connected to the first voltage adjusting element. The first charging element is a concept corresponding to the first capacitor of FIG. 2.

The timing adjusting unit 520 performs a function of adjusting a timing when a timing for removing the pop noise is set by the timing adjusting unit. The timing adjusting unit is the same concept as the timing adjusting unit 120 of FIG. 1.

At least two timing adjusting units may be provided in the audio signal muting apparatus. When two timing adjusting units are provided in the audio signal muting apparatus, the timing adjusting units may include a third voltage adjusting element, a second charging element, a fifth voltage adjusting element, and a fourth charging element.

The third voltage adjusting element performs a function of additionally adjusting an output voltage for an audio signal in which an output voltage is adjusted by the timing setting unit. One side of the third voltage adjusting element is connected to a second control element connected to a first control element which receives a mute control signal which mutes the audio signal and the other side is connected to the fifth voltage adjusting element by means of a second path.

The first control element is an element which is connected to the ground to perform a switching function and the second control element is connected to a positive power source and a negative power source to perform a switching function. The third voltage adjusting element is a concept corresponding to the third resistor of FIG. 2 and the second control element is a concept corresponding to the second transistor of FIG. 2. The fifth voltage adjusting element is a concept corresponding to the fifth resistor of FIG. 2.

The fifth voltage adjusting element performs a function of additionally adjusting an output voltage for an audio signal in which an output voltage is adjusted by the third voltage adjusting element. One side of the fifth voltage adjusting element is connected to the third voltage adjusting element by means of a second path and the other side is connected to a mute control unit.

The second charging element is connected to the third voltage adjusting element by means of the first path and the fourth charging element is connected to the fifth voltage adjusting element. The second charging element is a concept corresponding to the second capacitor of FIG. 2 and the fourth charging element is a concept corresponding to the fourth capacitor of FIG. 2.

The timing setting unit performs a function of catching an overall mute timing in the exemplary embodiment and the timing adjusting unit performs a function of catching a detailed mute timing in the exemplary embodiment. In consideration of this, the timing setting unit sets a timing based on at least one pop noise having a magnitude which is equal to or larger than a first reference value and the timing adjusting unit controls the timing based on at least one pop noise having a magnitude which is equal to or larger than a second reference value. The second reference value is smaller than the first reference value.

When the timing to remove the pop noise is set and adjusted by the timing setting unit and the timing adjusting unit, the mute control unit preforms a function of muting the audio signal based on the timing.

The mute control unit may include a first mute processing unit and a second mute processing unit.

The first mute processing unit performs a function of muting an audio signal at a time when the negative pop noise exists based on the timing. The first mute processing unit is the same concept as the first mute processing unit 130 of FIG. 1.

The second mute processing unit performs a function of muting an audio signal at a time when the positive pop noise exists based on the timing. The second mute processing unit is the same concept as the second mute processing unit 140 of FIG. 1.

At least one of the first mute processing unit and the second mute processing unit includes two voltage control elements. When the first mute processing unit includes two voltage control elements, pins of the first voltage control element provided in the first mute processing unit may be disposed to face pins of the second voltage control elements provided in the first mute processing unit. Further, pins of the third voltage control element provided in the second mute processing unit may be disposed to face pins of the fourth voltage control elements provided in the second mute processing unit. The first voltage control element is a concept corresponding to the first FET of FIG. 2 and the second voltage control element is a concept corresponding to the second FET of FIG. 2. Further, the pins of each voltage control element are concepts corresponding to the drain and the source of the FET.

Even though it has been described above that all components of the exemplary embodiment of the present invention are combined as one component or operate to be combined, the present invention is not limited to the exemplary embodiment. In other words, one or more components may be selectively combined to be operated within a scope of the present invention. Further, all components may be implemented as one independent hardware but a part or all of the components are selectively combined to be implemented as a computer program which includes a program module which performs a part or all functions combined in one or plural hardwares. Further, such a computer program may be stored in a computer readable media such as a USB memory, a CD disk, or a flash memory to be read and executed by a computer to implement the exemplary embodiment of the present invention. The recording media of the computer program may include a magnetic recording medium or an optical recording medium.

The present embodiments are provided to explain the technical spirit of the present embodiment and the scope of the technical spirit of the present embodiment is not limited by these embodiments. The protection scope of the present embodiments should be interpreted based on the following appended claims and it should be appreciated that all technical spirits included within a range equivalent thereto are included in the protection scope of the present embodiments.

What is claimed is:

1. An audio signal muting apparatus, comprising:
a mute control unit which removes a pop noise from an audio signal;
a timing setting unit which sets a timing to remove the pop noise from the audio signal; and
a timing adjusting unit which adjusts the timing,
wherein a negative power is applied to the mute control unit to remove a negative pop noise,
wherein the timing setting unit and the mute control signal are connected by means of a first control element which performs a switching function, and the timing setting unit and the timing adjusting unit are connected by means of a second control element which performs a switching function, and wherein the timing adjusting unit includes:
- a first timing adjusting unit connected to the second control element; and
- a second timing adjusting unit connected to the first timing adjusting unit and the mute control unit,
- wherein the first timing adjusting unit is connected to a resistor and the resistor is connected to the negative power.

2. The audio signal muting apparatus according to claim 1, wherein a gate of a transistor implemented in the mute control unit is controlled based on the negative power to adjust a voltage difference between the gate and a source of the transistor.

3. The audio signal muting apparatus according to claim 2, wherein the larger the magnitude of the negative pop noise, the larger the voltage difference between the gate and the source is set.

4. The audio signal muting apparatus according to claim 1, wherein as the negative power applied to the mute control unit, a negative voltage existing on a circuit implemented in the audio signal muting apparatus is applied.

5. The audio signal muting apparatus according to claim 4, wherein the negative voltage is set to a fixed or variable value.

6. The audio signal muting apparatus according to claim 1, wherein the mute control unit includes a plurality of transistors which is connected with a dual transistor structure in which sources and drains of the plurality of transistors face each other.

7. The audio signal muting apparatus according to claim 6, wherein the mute control unit includes a first transistor and a second transistor and the negative power is applied to a first gate of the first transistor and a second gate of the second transistor.

8. The audio signal muting apparatus according to claim 1, wherein the second control element is connected to the negative power.

9. The audio signal muting apparatus according to claim 8, wherein the second control element and the negative power are connected by means of the resistor.

10. The audio signal muting apparatus according to claim 1, wherein the mute control unit includes:
- a first mute processing unit which mutes the audio signal at a time when the negative pop noise exists based on the timing; and
- a second mute processing unit which mutes the audio signal at a time when a positive pop noise exists based on the timing.

11. The audio signal muting apparatus according to claim 1, wherein the timing setting unit sets the timing based on at least one pop noise having a magnitude which is equal to or higher than a first reference value and the timing adjusting unit adjusts the timing based on at least one pop noise having a magnitude which is equal to or higher than a second reference value smaller than the first reference value.

12. A digital signal conversion apparatus, comprising:
- a converting unit which converts an input digital audio signal into an analog audio signal;
- a clock generating unit which determines an operation timing to convert the digital audio signal into the analog audio signal based on the digital audio signal;
- an amplifying unit which amplifies the analog audio signal; and
- an audio signal muting device which mutes the analog audio signal based on a timing to remove a pop noise,
wherein the audio signal muting device comprises:
- a mute control unit which removes the pop noise from the analog audio signal;
- a timing setting unit which sets a timing to remove the pop noise from the audio signal; and
- a timing adjusting unit which adjusts the timing,
wherein a negative power is applied to the mute control unit to remove a negative pop noise,
wherein the timing setting unit and the mute control signal are connected by means of a first control element which performs a switching function, and the timing setting unit and the timing adjusting unit are connected by means of a second control element which performs a switching function, and
wherein the timing adjusting unit includes:
- a first timing adjusting unit connected to the second control element; and
- a second timing adjusting unit connected to the first timing adjusting unit and the mute control unit,
- wherein the first timing adjusting unit is connected to a resistor and the resistor is connected to the negative power.

* * * * *